United States Patent [19]

Teague et al.

[11] Patent Number: 4,468,644

[45] Date of Patent: Aug. 28, 1984

[54] TUNABLE REJECT FILTER FOR RADAR WARNING RECEIVER

[75] Inventors: Randy Teague, Plainview; Lawrence H. Silverman, Dix Hills; Novellone Rozario, Jericho, all of N.Y.

[73] Assignee: General Instrument Corp., Clifton, N.J.

[21] Appl. No.: 421,971

[22] Filed: Sep. 23, 1982

[51] Int. Cl.³ .................... H01P 1/203; H03H 7/01
[52] U.S. Cl. .................................. 333/205; 333/35; 333/176; 333/185; 334/15; 334/45; 455/182
[58] Field of Search .................. 333/167, 174–176, 333/219–223, 202, 204–207, 246, 32–35, 231, 232, 235, 185; 334/11, 15, 41, 45; 455/169, 182, 286

[56] References Cited

U.S. PATENT DOCUMENTS

| | | | |
|---|---|---|---|
| 3,079,571 | 2/1963 | Elliot et al. | 333/174 |
| 3,651,409 | 3/1972 | George et al. | 334/45 |
| 3,864,824 | 2/1975 | Watson et al. | 333/185 |
| 4,283,694 | 8/1981 | Pauker | 333/34 |
| 4,339,559 | 8/1983 | Theriault | 334/15 X |

Primary Examiner—Marvin L. Nussbaum
Attorney, Agent, or Firm—James & Franklin

[57] ABSTRACT

Spaced conductive strips are formed on a substrate. A first transmission line transformer is connected between the input and one end of the first strip. A second transmission line transformer is connected between the other end of the first strip and the output. The second strip is connected to ground. A shunt tuning circuit is connected between the strips. The circuit includes first and second MOS capacitors mounted on and connected to the grounded strip. An RF choke interconnects the other side of each capacitor. A varactor diode is mounted on and connected to the first capacitor. An etched spiral inductor connects the varactor and the first strip. A bias signal is applied to the junction between the choke and the second capacitor in order to tune the filter.

14 Claims, 3 Drawing Figures

TUNABLE REJECT FILTER FOR RADAR WARNING RECEIVER

The present invention relates to band reject filters and, more particularly, to a band reject filter which is tunable in the microwave range and can be implemented using microstrip techniques.

Many radar warning systems include receivers which can be rendered temporarily ineffective ("jammed") if an impinging signal is received which is powerful enough to saturate the receiver. In order to overcome this problem, a tunable filter is employed to attenuate the jamming signal and permit normal operation of the system.

YIG (yttrium-iron-garnet) filters have heretofore been commonly utilized in radar warning systems for this purpose. A YIG filter is tunable in accordance with a current signal. Once the jamming signal is detected, the frequency of the detected signal is determined. Because the YIG filter is tuned by means of a current control signal, the frequency of the detected signal is converted into a current control signal which thereafter is applied to the YIG filter to tune the filter to attenuate the frequency of the detected signal. The need to supply a current control signal is a complicating factor compared with providing a voltage control signal.

The conventional YIG filter requires a relatively long time to tune, normally on the order of milliseconds. Moreover, conventional YIG filters require a relatively large space and are quite heavy, characteristics which are disadvantageous for radar warning systems, particularly those designed for mobile applications such as for use on aircraft.

It is, therefore, a prime object of the present invention to provide a tunable reject filter for a radar warning receiver which is compact and light-weight and, therefore, ideal for use in mobile applications.

It is another object of the present invention to provide a tunable reject filter for a radar warning receiver which can be manufactured utilizing microstrip techniques.

It is another object of the present invention to provide a tunable reject filter for radar warning receiver which has high speed tuning capability.

It is another object of the present invention to provide a tunable reject filter for a radar warning receiver wherein the filter is tunable in accordance with a DC voltage bias signal.

It is another object of the present invention to provide a tunable reject filter for a radar warning receiver which is inexpensive to produce and functions reliably.

In accordance with the present invention, a band reject filter tunable in the microwave range is provided. The filter is usable in conjunction with a bias signal generator and is adapted to be formed on a substrate. The filter comprises input means, output means, and first and second conductive strips situated at spaced locations on the substrate. First impedance transformer means are operably connected between the input means and one end of the first conductive strip. Second input transformer means are operably connected between the other end of the first conductive strip and the output means. A reference signal source is operably connected to the second conductive strip. Shunt tuning means are operably connected between the first and second conductive strips. The shunt tuning means comprises first and second MOS capacitor means mounted on the second strip. Each of the capacitor means has a first terminal operably connected to the second strip, and a second terminal. RF choke means operably connect the second terminals of the respective capacitor means. Varactor means is mounted on the first capacitor means and has a first terminal operably connected to the second terminal of the first capacitor means, and a second terminal. Discrete inductor means are operably connected between the second terminal of the varactor means and the first conductive strip. Means are provided for operably connecting the first and second strips for maintaining the strips at substantially equal DC potentials. Means, operably connected to the second terminal of the second capacitor means, are provided for receiving the bias signal to tune the filter.

Preferably, second shunt tuning means are operably connected in parallel with the first shunt tuning means between the first and second conductive strips. The first and second shunt means are preferably spaced along the substrate a distance substantially equal to one-quarter of the average wavelength of the tunable range of the filter.

The second shunt tuning means comprises third and fourth MOS capacitor means mounted on the second strip. Each of the third and fourth capacitor means has a first terminal operably connected to the second strip, and a second terminal. RF choke means operably connect the second terminals of the third and fourth capacitor means. Second varactor means are mounted on the third capacitor means and has a first terminal operably connected to the second terminal of the third capacitor means, and a second terminal. Discrete inductor means are operably connected between the second terminal of the second varactor means and the first conductive strip. Means, operably connected to the second terminal of the fourth capacitor means, are provided for receiving a bias signal to tune the filter.

The first and second impedance transformer means each preferably comprises a 2-6 gigahertz quarterwave transmission line impedance transformer. The impedance at the input means is normally relatively high, for example, 50 ohms. The first impedance transformer means converts the relatively high 50 ohm input impedance to a relatively low impedance, for example, 16.7 ohms. The second input transformer means reconverts the relatively low impedance back to the original impedance at the output means.

The MOS capacitor means each preferably have a capacitance of 50 picofarad or more. The RF choke means preferably comprises a discrete inductor coil. The coil preferably has eight turns. The inductor means preferably comprises an etched spiral inductor. The means connecting the first and second conductive strips preferably comprises an induction coil. The substrate is preferably comprised of alumina, approximately 10 mils. thick.

To these and such other objects which may hereinafter appear, the present invention relates to a tunable reject filter for a radar warning receiver, as described in detail in the following specification and recited in the annexed claims, taken together with the accompanying drawings, wherein like numerals refer to like parts, and in which:

Figure 1:
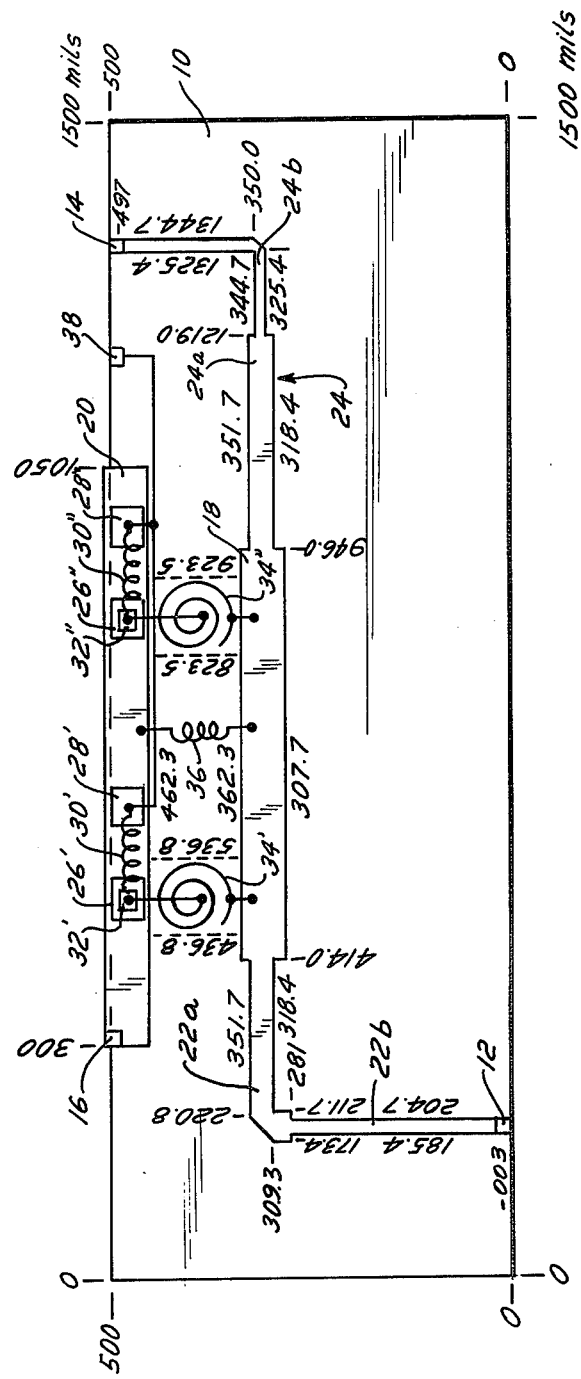
FIG. 1 is a top plan view of a substrate upon which the tunable reject filter of the present invention has been formed.

The filter of the present invention is designed for use in the microwave range and may be formed by conventional microstrip techniques on a substrate 10, preferably composed of alumina, approximately 500 mils. wide, 1500 mils. long, and 10 mils. thick. Substrate 10 is provided with an input terminal 12 adjacent one edge of the substrate, and an output terminal 14 at the opposite edge of the substrate. In addition, a ground terminal 16 is provided near or at the rear edge of the substrate.

The top surface of substrate 10 is provided with first and second conductive strips 18 and 20, respectively. Second conductive strip 20 is electrically connected to ground terminal 16 and, consequently, is maintained at ground, that is, at a reference potential. Input terminal 12 is connected to one end of strip 18 through a first transmission line impedance transformer 22. The other end of strip 18 is connected to output terminal 14 through a second transmission line impedance transformer 24.

Figure 3:
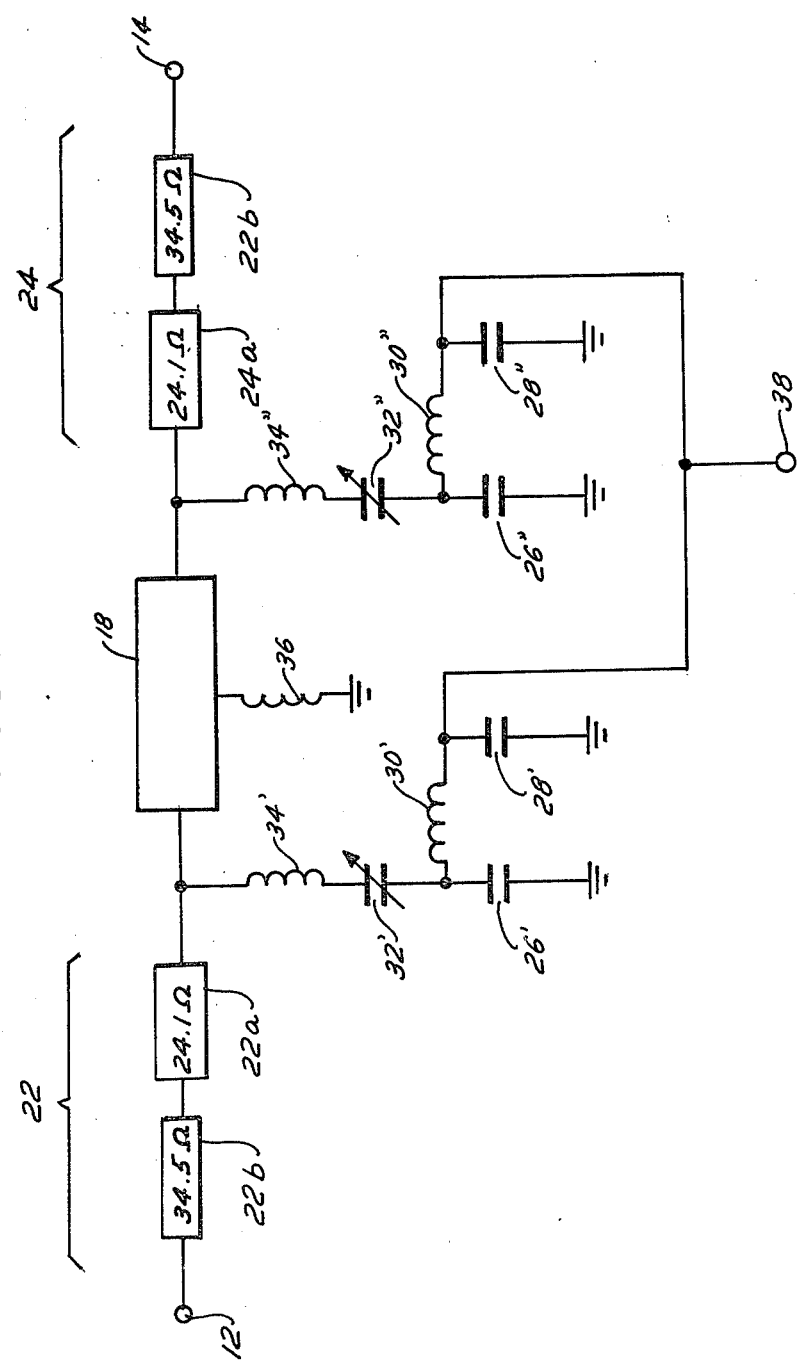
FIG. 3 is a schematic diagram of the tunable reject filter of the present invention.

Each of the impedance transformers 22 and 24 are preferably 2-6 GHz quarterwave impedance transformers. As shown in FIG. 1, each transformer 22, 24 comprises two transmission lines 22a, 22b and 24a, 24b of different width. This structure permits the transformers to operate over a relatively wide bandwidth. In FIG. 3, transformer 22 is schematically shown as a 34.5 ohm line, 22a and a 24.1 ohm line, 22b and transformer 24 is shown as a 24.1 ohm line, 24a and a 34.5 ohm line, 24b.

It is desirable that the filter of the present invention be as selective as possible with respect to the frequency band which is being attenuated. If the attenuation were plotted against frequency, the characteristic of the filter should have a "V"-shape reject band. Because of the shape of this portion, filters of this type are commonly known as "notch" filters.

The impedance change produced by transformers 22 and 24 determines the shape of the "notch". The lower the impedance at which the filter operates, the narrower the "notch", that is, the smaller the reject bandwidth and the more selective the circuit. On the other hand, a higher impedance results in a greater degree of attenuation. Thus, in designing the circuit, this trade-off must be considered.

In the present invention, it is desirable that this "notch" be as narrow as possible, such that the filter be highly frequency selective. In order to achieve this relatively narrow reject band, impedance transformers 22 and 24 are employed such that the filter operates at a relatively low impedance, as compared to the impedance of the remainder of the system. For example, if the impedance at input terminal 12 is at a relatively high 50 ohms, impedance transformer 22 will lower the impedance such that conductive strip 18 is at a substantially lower impedance, for example, an impedance of 16.7 ohms. The relatively low impedance of conductive strip 18 is converted back to the higher impedance level of the system by impedance transformer 24. Thus, by operating the filter at a relatively low impedance, the degree of attenuation is sacrificed to some extent for high selectivity. However, the degree of attenuation may be enhanced through the use of multiple shunt turning circuits.

One or more shunt tuning circuits are provided between conductive strips 18 and 20. The filter of the present invention will function acceptably with a single shunt tuning circuit. However, the degree of attenuation of the filter can be enhanced if two or more shunt tuning circuits are provided in parallel and spaced apart a distance which is a function of the tuning range of the filter. While the figures illustrate the filter with two spaced shunt tuning circuit, it should be understood that only a single shunt tuning circuit or three or more parallel shunt tuning circuits may be utilized in the present invention to provide a higher degree of attenuation. The figures illustrate the filter with two shunt tuning circuits for purposes of explanation only and same should not be considered a limitation on the present invention.

Each shunt tuning circuit is connected between conductive strips 18 and 20 and is preferably comprised of the identical components. For ease of explanation and understanding, the corresponding components in each shunt tuning circuit will be labelled with the same numeral, but the components in the first shunt tuning circuit (left in the figures) will be designated by a prime ('), whereas the components in the second shunt tuning circuit (right in the figures) will be designated by a double prime (").

Figure 2:
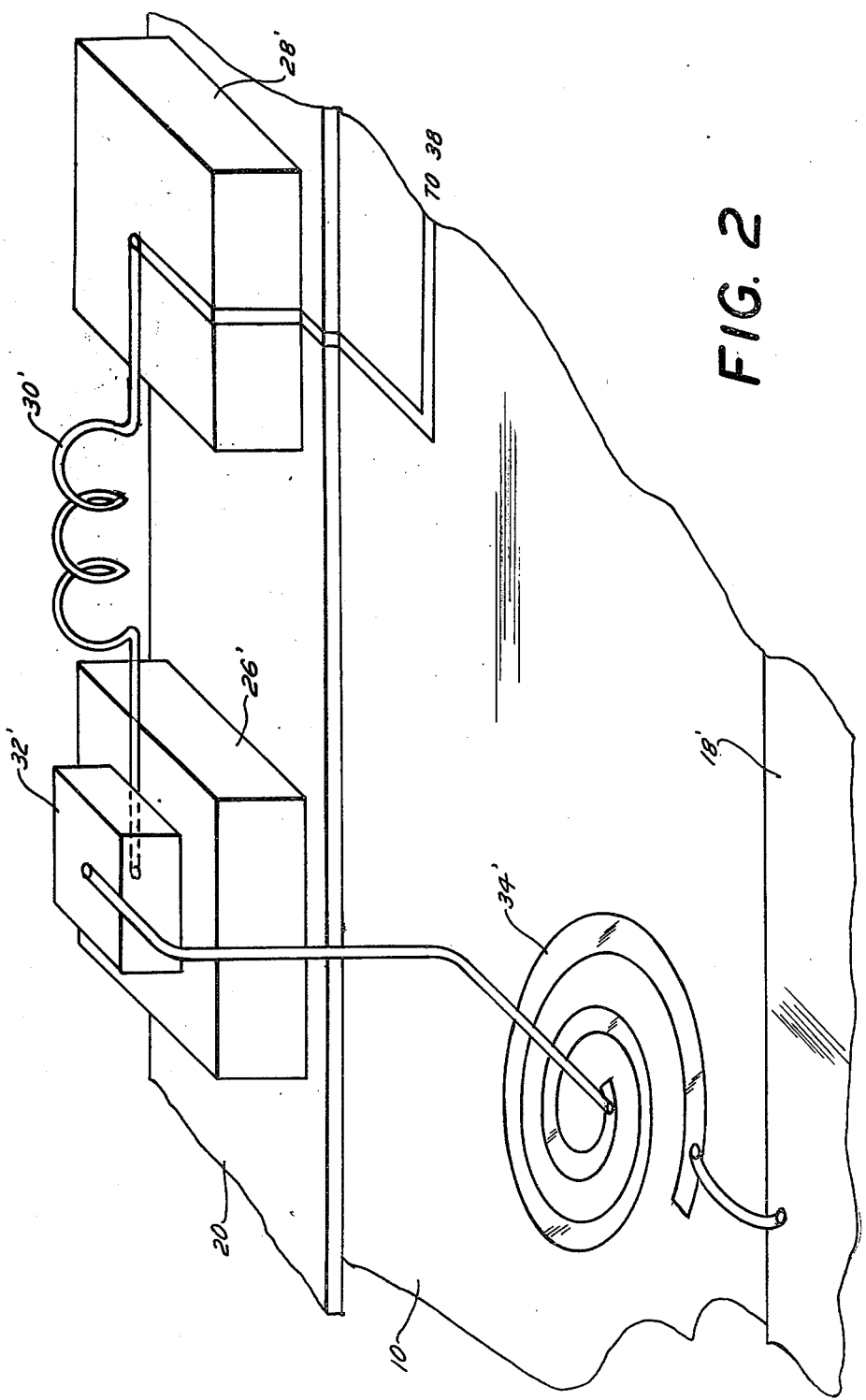
FIG. 2 is a perspective view of a portion of the filter of the present invention showing one shunt tuning means.

Each shunt tuning circuit includes first and second MOS capacitors 26 and 28, each preferably having a capacitance of at least 50 pf. As shown in FIGS. 1 and 2, capacitors 26 and 28 are physically mounted on top of strip 20 at spaced locations thereon. One terminal of each of the capacitors 26, 28 is electrically connected to strip 20 and, thus, to ground. The other terminal of each of the capacitors 26 and 28 are connected together through an RF choke, preferably in the form of a discrete eight-turn induction coil 30. Coil 30 preferably has a diameter of approximately 10-25 mils. and a length of approximately 40-50 mils.

Physically mounted on top of capacitor 26 is a varactor diode 32, preferably having a 0.4 pf capacitance at −4 volts and a capacitance ratio of 3:1 with a high Q value. One terminal of varactor 32 is electrically connected to the junction node between coil 30 and capacitor 26. The other terminal of varactor 32 is connected through an etched spiral inductor 34 to conductive strip 18. Inductor 34 preferably has a diameter of approximately 100 mils. Conductive strip 18 is maintained at DC ground by connecting an inductor 36 between conductive strips 18 and 20.

The bias level range will typically be from 0 to 30 volts, if an abrupt junction varactor diode is employed, and between 0 and 20 volts, if a hyperabrupt junction varactor diode is employed. In either case, the bias voltage signal is developed by detecting the jamming signal, converting the frequency of the jamming signal into a digital number, by means of a conventional frequency-to-digital converter, and thereafter employing a digital-to-analog converter to generate the DC bias voltage signal which is a function of the frequency of the detected signal.

The tuning range for the filter of the present invention can be adjusted by changing the spiral size of inductor 34 and the physical spacing between the shunt tuning circuits. It can be demonstrated that an etched spiral inductor will function acceptably in a range up to 6 GHz. However, above 6 GHz, it is necessary to replace the etched spiral inductor 34 with a straight transmission line strip.

If the shunt tuning circuits are spaced apart by one quarter wavelength of the average frequency in the range through which the filter may be tuned, an extra 6 dB of attenuation may be obtained. In some instances, it may be desirable to include a third conductive strip (not shown) proximate the bottom edge of substrate 10 and to connect shunt tuning circuits between the second and third conductive strips, instead of between the first and second conductive strips. The spacing between the tuning circuits should, however, remain as indicated.

The values of the various components of the filter described above relate to a filter which has been designed to operate in the 2 to 3.5 GHz tuning band. With this design $\geq 20$ dB rejection at bandwidths of 100 mHz and $\geq 40$ dB rejection at bandwidths of 10 mHz have been achieved with an insertion loss of 1 dB outside of the tunable reject band. The bandwidth for which the filter has $\geq 10$ dB insertion loss is typically 400 mHz.

It should now be appreciated that the present invention relates to a tunable reject filter for a radar warning receiver which can be fabricated using microstrip techniques such that the filter is small in size, light in weight, inexpensive to manufacture, and is highly reliable. In addition, the filter of the present invention is tunable in microseconds, as compared to the millisecond tuning of a conventional YIG band reject filter and, consequently, is an order of magnitude faster than the conventional YIG filter. In addition, the filter of the present invention is tuned by means of an easily generated voltage bias signal.

While only a single embodiment of the present invention has been disclosed herein for purposes of illustration, it is obvious that many variations and modifications could be made thereto, particularly with respect to the specific parameters of the components, which may be selected in accordance with the results desired. It is intended to cover all of these variations and modifications which fall within the scope of the present invention, as defined by the following claims.

We claim:

1. A band reject filter tunable in the microwave range, usable in conjunction with a bias voltage signal generator and a reference signal source, and adapted to be formed on a substrate, said filter comprising: input means; output means; first and second conductive strips situated at spaced locations on the substrate; first impedance transformer means operably connected between said input means and one end of said first strip; second impedance transformer means operably connected between the other end of said first strip and said output means; means for operably connecting said reference source and said second strip; and shunt tuning means operably connected between said first and second strips, said shunt means comprising: first and second capacitor means, each of said capacitor means having a first terminal operably connected to said second strip, and a second terminal; RF choke means operably connected between said second terminals of said first and second capacitor means; varactor means having a first terminal operably connected to said second terminal of said first capacitor means, and a second terminal; discrete inductor means operably connected between said second terminal of said varactor means and said first conductive strip; and means operably connected to said second terminal of said second capacitor means for receiving the bias signal.

2. The filter of claim 1, wherein said capacitor means are MOS capacitors.

3. The filter of claim 1, wherein said capacitor means are mounted on said second strip.

4. The filter of claim 1, wherein said varactor means is mounted on said first capacitor means.

5. The filter of claim 1, wherein said first and second impedance transformer means comprise transmission lines situated on said substrate.

6. The filter of claim 1, wherein the impedance at said input means is relatively high and said first transformer means converts said relatively high impedance to a relatively low impedance.

7. The filter of claim 6, wherein the impedance at said output means is relatively high and said second transformer means converts said relatively low impedance to said relatively high impedance.

8. The filter of claim 1, wherein said RF choke means comprises a discrete inductor coil.

9. The filter of claim 1, wherein said inductor means comprises an etched spiral inductor.

10. A band reject filter tunable in the microwave range, usable in conjunction with a bias voltage signal generator and a reference signal source, and adapted to be formed on a substrate, said filter comprising: input means; output means; first and second conductive strips situated at spaced locations on the substrate; first impedance transformer means operably connected between said input means and one end of said first strip; second impedance transformer means operably connected between the other end of said first strip and said output means; means for operably connecting said reference source and said second strip; and shunt tuning means operably connected between said first and second strips, said shunt means comprising: first and second capacitor means, each of said capacitor means having a first terminal operably connected between said second terminals of said first and second capacitor means; varactor means having a first terminal operably connected to said second terminals of said first and second capacitor means; varactor means having a first terminal operably connected to said second terminal of said first capacitor means, and a second terminal; discrete inductor means operably connected between said second terminal of said varactor means and said first conductive strip; and means operably connected to said second terminal of said second capacitor means for receiving the bias signal, and further comprising second shunt tuning means operably connected in parallel with said shunt tuning means between said first strip and said second strip.

11. The filter of claim 10, wherein said first and second shunt means are spaced along the substrate a distance substantially equal to one quarter of the average wavelength of the tunable range of the filter.

12. The filter of claim 10, wherein said second shunt tuning means comprises: third and fourth MOS capacitor means situated on said second strip, each of said third and fourth capacitor means having a first terminal operably connected to said second strip, and a second terminal; RF choke means operably connected between said second terminals of said third and fourth capacitor means; second varactor means mounted on said third capacitor means and having a first terminal operably connected to said second terminal of said third capacitor means, and a second terminal; discrete inductor means operably connected between said second terminal of said second varactor means and said first strip; and means operably connected to said second terminal of said fourth capacitor means for receiving the bias signal.

13. A band reject filter tunable in the microwave range, usable in conjunction with a bias voltage signal generator and a reference signal source, and adapted to be formed on a substrate, said filter comprising: input means; output means; first and second conductive strips situated at spaced locations on the substrate; first impedance transformer means operably connected between said input means and one end of said first strip; second impedance transformer means operably connected between the other end of said first strip and said output means; means for operably connecting said reference source and said second strip; and shunt tuning means operably connected between said first and second strips, said shunt means comprising: first and second capacitor means, each of said capacitor means having a first terminal operably connected between said second terminals of said first and second capacitor means; varactor means having a first terminal operably connected to said second terminals of said first and second capacitor means; varactor means having a first terminal operably connected to said second terminal of said first capacitor means, and a second terminal; discrete inductor means operably connected between said second terminal of said varactor means and said first conductive strip; and means operably connected to said second terminal of said second capacitor means for receiving the bias signal, and further comprising means operably connecting said strips for maintaining said strips at a substantially equal DC potential.

14. The filter of claim 13, wherein said means connecting said first and second strips comprises an inductor coil.